United States Patent [19]

Damerow et al.

[11] Patent Number: 4,689,721
[45] Date of Patent: Aug. 25, 1987

[54] DUAL PRINTED CIRCUIT BOARD MODULE

[75] Inventors: Milton F. Damerow, Paway; Michael J. Kocin, San Diego, both of Calif.

[73] Assignee: TRW Inc., Redondo Beach, Calif.

[21] Appl. No.: 848,878

[22] Filed: Apr. 7, 1986

Related U.S. Application Data

[63] Continuation-in-part of Ser. No. 817,635, Jan. 10, 1986, abandoned.

[51] Int. Cl.$^4$ ............................................. H05K 7/20
[52] U.S. Cl. ................................... 361/388; 361/413; 361/398; 439/67
[58] Field of Search ........... 339/112 R, 17 F, 17 LM, 339/17 M, 176 MP; 361/386, 388, 398, 395, 399, 412, 413, 414, 425, 426

[56] References Cited

U.S. PATENT DOCUMENTS

| | | | |
|---|---|---|---|
| 3,147,402 | 9/1964 | Hochstetler | 361/412 |
| 3,382,414 | 5/1968 | Borner | 361/412 |
| 3,546,775 | 12/1970 | Lalmond | 339/17 F |
| 3,593,064 | 7/1971 | Eitra | 361/388 |
| 3,727,168 | 4/1973 | Henschen | 361/398 |
| 3,735,206 | 5/1973 | Pesek | 361/386 |

OTHER PUBLICATIONS

IBM Tech. Discl. Bull., vol. 13, No. 7, 12/1970, p. 2076, "Electronic Page Assembly," Damari.

Primary Examiner—G. P. Tolin
Attorney, Agent, or Firm—Noel F. Heal; Robert J. Stern

[57] ABSTRACT

A dual printed circuit board module having two printed circuit boards mounted in an inwardly facing relationship on two thermal frame members that also function as structural and enclosing members. A connector mounted between and at one edge of the thermal frame members serves to establish electrical connections between the circuit boards and a backplane circuit panel to which the boards are to be connected. A flexible interconnect circuit, located near the same edge of the boards as the backplane connector, is used both to connect the boards to the connector and to provide board-to-board connections independently of the connector. This arrangement greatly facilitates assembly and testing of the module, reduces signal path lengths, and enhances the structural and thermal integrity of the module.

5 Claims, 3 Drawing Figures

DUAL PRINTED CIRCUIT BOARD MODULE

This is a continuation-in-part of application Ser. No. 817,635, filed on Jan. 10, 1986, and having the same title, and now abandoned.

BACKGROUND OF THE INVENTION

This invention relates generally to packaging of electronic components and, more specifically, to assemblies of dual printed circuit boards (PCBs). In many electronics systems, such as avionics systems, electronic modules are packaged on printed circuit boards having edge connectors for plugging into a larger board known as a backplane or a mother board. The PCB modules are oriented parallel with each other and perpendicular to the backplane.

In one conventional form of this arrangement, the PCB modules are assembled in pairs, each forming a dual PCB module with a single connector at one edge of the module. The conventional technique for pakaging dual PCB modules is to mount them back to back on a common frame providing both structural and thermal functions. In other words, the frame functions both as a structural support and as a thermal conductor to dissipate heat generated in the modules, transmitting it to a larger frame in the system. The circuit components must usually be protected from the environment in which they are used. Therefore, the use of a common central frame usually requires that separate covers be mounted over each of the PCBs, which typically have components of various heights projecting above board level. The need for separate covers increases the module thickness, which results in lower overall component packing density. Moreover, the covers contribute little to the structural and thermal integrity of the assembly, and testing and maintenance of the modules is rendered much more difficult.

Another difficulty with dual PCB modules of the prior art results from a requirement for connections between boards, as well as from the boards to the backplane. In part, this requirement arises from a limited backplane capacity to handle input and output signals to and from the boards. Some of these signals are, therefore, routed from one board to another before reaching the backplane. In the past, these intramodule connections have been established by means of a special connector assembly or a flexible printed-circuit connector at the "top" edge of the boards, opposite the "bottom" edge where a backplane connector is located. Obviously, the terms "top" and "bottom" are used only for convenience. The orientation of the backplane and circuit boards is not limited.

This arrangement for intramodule connection increases the complexity of conductor routing on the boards, increases some input/output circuit lengths, and may reduce the amount of board area or "real estate" available for components on the boards. In addition, the dual module made in this manner is difficult to test and maintain, since access to the backs of the circuit boards is precluded after installation of the inter-board connector at the top edge of the module.

It will be appreciated that there is a need for an improved dual PCB module. Ideally, the structure should maintain structural and thermal integrity, but should minimize circuit complexity and permit easy access for testing and maintenance. The present invention satisfies these needs.

SUMMARY OF THE INVENTION

The present invention resides in a dual PCB module assembly in which both off-board and inter-board connections are established at the same edge of the assembly. Briefly, and in general terms, the assembly of the invention comprises first and second thermal frame members, and first and second printed circuit boards mounted on the respective first and second thermal frame members with the circuit boards facing inwardly toward each other and the thermal frame members forming an outer cover as well as fulfilling thermal and structural functions. A multi-pin connector is mounted between the thermal frame members at one edge thereof, and the module further includes a flexible interconnect circuit having multiple conductors, extending from the first circuit board to the second circuit board through the multi-pin connector. The multi-pin connector includes means for establishing connections between selected pins of the connector and selected conductors in the flexible interconnect circuit, and means for establishing selected connections between the first and second boards, without contacting any of the pins of the connector assembly.

Some of the conductors in the flexible interconnect circuit are routed through the connector assembly without contacting any of the connector pins. These are the intramodule connections. Others of the conductors in the flexible interconnect circuit connect selected pins of the connector assembly to selected components on the two circuit boards. Because the off-board and inter-board connections are established at the same edge of the assembly, the connections can all be maintained for test purposes, even when the boards are swung apart by as much as one hundred and eighty degrees. Continuity of the connections is also maintained during assembly and prior to final closure of the module. This is to be contrasted with earlier dual PCB modules, in which connections could not be completed until final assembly of the module.

The invention reduces the signal path lengths for connections from board to board within the module. Most intramodule connection is required because backplane interconnect systems are typically partitioned into two equal groups, one for each board. If the number of input and output signals associated with a PCB is higher than the corresponding backplane connector can handle, signals are assigned to the other PCB by busing them between the two boards via the intramodule interconnect circuit. Prior to the present invention, this involved busing the signals over the top of the module. With intramodule connections available at the bottom of the module, these input/output path lengths can be reduced to about one half.

Another advantage of the invention is that the thermal integrity of the assembly is enhanced. Each of the thermal frame members is applied totally to heat conduction, whereas prior approaches required environmental covers that did not contribute significantly to the thermal conduction qualities of the structure.

Structural integrity is also enhanced by the invention, due to a more efficient distribution of mass about the central axis of the module. The improved module has increased stiffness, which results in higher resonant frequencies and reduced deflections and stress levels as compared with prior approaches.

Finally, test procedures are facilitated in the module of the invention, since the top of the module is completely available for test connectors, status indicator lights, and the like. These components can be located on either of the circuit boards, and will not interfere with the intramodule connections, since these are made at the opposite end of the module.

It will be appreciated from the foregoing that the present invention represents a significant advance over dual PCB modules of the prior art. In particular, the invention accomplishes both module-to-backplane and intramodule connections at the same edge of the module, thereby simplifying assembly and testing, reducing signal path lenghs, and improving structural and thermal integrity. Other aspects and advantages of the invention will become apparent from the following more detailed description, taken in conjunction with the accompanying drawings.

DESCRIPTION OF THE PREFERRED EMBODIMENT

Figure 1:
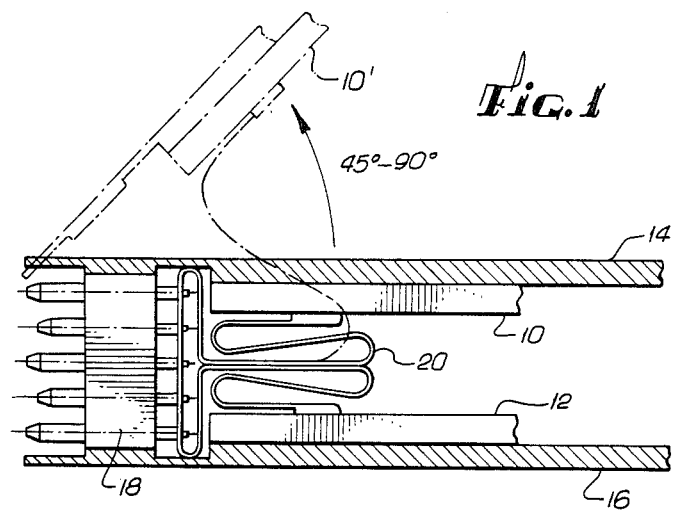
FIG. 1 is a fragmentary elevational view, partly in section, of a dual PCB module in accordance with the invention.

As shown in the drawings for purposes of illustration, the present invention is principally concerned with dual printed circuit board (PCB) modules, in whch two circuit boards are constructed as a single assembly for connection to a backplane or mother board. In the past, the two PCBs have been assembled on a common central frame, with outwardly facing components. A connector at the bottom edge is used to provide connections to the backplane, and a flexible or other special connector makes intramodule connections across the top of the module.

In accordance with the invention, a dual PCB module is constructed with each circuit board mounted on a separate thermal frame member, with the circuit components facing inwardly, and both backplane connections and intramodule connections are effected at a single connector and flex printed circuit assembly at the bottom edge of the module.

FIG. 1 shows the structure of the invention, including the two circuit boards, indicated by reference numerals 10 and 12, mounted on thermal frame members 14 and 16, respectively. As shown in the drawing, the circuit components mounted on the boards 10 and 12 face inwardly when the module is in its assembled condition, and the thermal frame members 14 and 16 face outwardly and function as environmental covers for the module. The frame members also perform conventional thermal and structural functions.

A molded connector 18 is located between the frame members 14 and 16 at one edge, referred to for convenience as the bottom edge. The connector 18 can be of any conventional mulit-pin type, such as a 250-pin NAFI connector used for establishing electrical connection with a backplane (not shown).

The other principal component of the invention is a flexible interconnect circuit 20, which extends between the boards 10 and 12 and makes contact with the connector 18. The interconnect is preferably of a flexible printed-circuit assembly, usually known as flex-print, and includes an excesslength portion that is folded on itself when the module is in an assembled condition, and permits the boards 10 and 12 to be pivoted angularly apart for testing or maintenance.

Figure 2A:
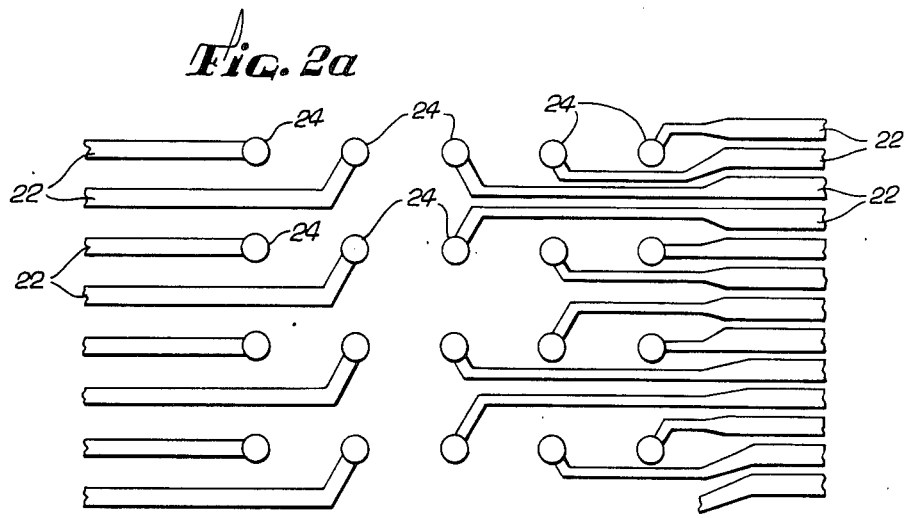
FIGS. 2a and 2b are schematic plan views of two layers of a connector employed in the assembly of the invention, showing the signal traces from module to connector pins (FIG. 2a) and from circuit board to circuit board (FIG. 2b).
Figure 2B:
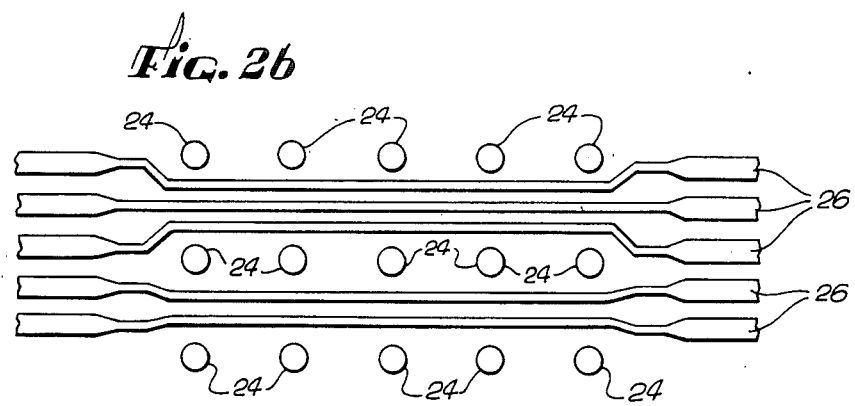

As shown in more detail in FIGS. 2a and 2b, the flexible connector 20 may include two layers of parallel conductor traces. FIG. 2a shows by way of example a first layer of conductor traces 22, each of which terminates at a connector pin 24 of the connector 18, and is bonded to the pin by appropriate means, such as soldering. In a second layer, shown by way of example in FIG. 2b, conductor traces 26 extend through the connector 18 without interruption and without contact with the connector pins 24. This multi-layer arrangement is preferred in most cases, since it facilitates the intramodule connections without making heavy demands for space. Solder connections to the pins 24 take considerably more area than the width of a single conductor trace, and it is usually more convenient to accommodate these soldered connections on a separate layer. Clearly, however, the backplane connections and the intramodule connections could be made using a single-layer flexible connector, with possibly some increased difficulty of conductor routing through the connector 18.

The circuit boards 10 and 12 can be secured in their assembled condition by any conventional means. Screws or fasteners of any kind may be used to secure the lower edge portions of the boards 10 and 12 to the connector 18. In any event, removal of these fasteners on either side permits the one board to be pivoted angularly away from other, as shown in outline at 10'. With both boards swung apart, the angle between them can be as great as one hundred and eighty degrees, permitting easy access to the circuit components for testing or maintenance. Typically, the module would be opened in this manner only when installed in a test fixture. An important advantage of this arrangement is that all of the backplane connections and intramodule connections are maintained while the module is in the open position.

Another advantage of the invention is that the upper edge of the module is not encumbered by any intramodule connections and is left free for the installation of indicator lights, test connections, and so forth. These components can be installed on either of the boards 10 and 12, and will remain operational when the module is opened for testing or maintenance.

It will be appreciated from the foregoing that the present invention represents a significant advance in the field of dual PCB modules. In particular, the invention provides a module in which both backplane and intramodule connections are made at the same edge of the module. This not only permits better access to the module for assembly and testing, but also enhances thermal and structural integrity, and reduces input/output signal path lengths. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A dual printed circuit board (PCB) module assembly, comprising:
   first and second thermal frame members;
   first and second printed circuit boards mounted on the first and second thermal frame members, respectively, with the circuit boards facing inwardly toward each other and the thermal frame members forming an outer cover as well as fulfilling thermal and structural functions;

a multi-pin connector mounted between the thermal frame members at one edge thereof; and a flexible interconnect circuit having multiple conductors, extending from the first circuit board to the second circuit board and making selected connections to the multi-pin connector;

and wherein the multi-pin connector and flexible interconnect circuit include means for establishing connections between selected pins of the connector and selected conductors in the flexible interconnect circuit, and means for establishing selected connections between the first and second boards, without contacting any of the pins of the connector assembly.

2. A PCB module assembly as defined in claim 1, wherein:

the flexible interconnect circuit includes a first group of conductors for connection to pins of the connector, and a second group of conductors for connection from one PCB to the other without contacting pins of the connector.

3. A PCB module assembly as defined in claim 2, wherein:

the first and second groups of conductors are disposed on separate layers of the flexible interconnect circuit.

4. A PCB module assembly as defined in claim 1, wherein:

the flexible interconnect circuit is long enough to permit relative angular movement between the circuit boards, to facilitate assembly and testing of the boards.

5. A dual PCB module assembly as defined in claim 1, wherein:

the connector circuit takes the form of a strip of flexible material having printed conductive traces along its length.

* * * * *